United States Patent
Hirakawa et al.

(10) Patent No.: US 8,671,567 B2
(45) Date of Patent: Mar. 18, 2014

(54) METHOD FOR MANUFACTURING A PROBE FOR AN ELECTRICAL TEST

(75) Inventors: Hideki Hirakawa, Aomori (JP); Satoshi Kaizuka, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 590 days.

(21) Appl. No.: 12/939,879

(22) Filed: Nov. 4, 2010

(65) Prior Publication Data

US 2011/0115515 A1 May 19, 2011

(30) Foreign Application Priority Data

Nov. 19, 2009 (JP) .................................. 2009-263904

(51) Int. Cl.
*H01R 43/00* (2006.01)

(52) U.S. Cl.
USPC ................. 29/885; 29/874; 29/884; 439/219; 439/221; 439/866; 148/559; 148/675; 324/755.1; 324/755.11

(58) Field of Classification Search
USPC ............ 29/885, 874, 884; 439/219, 221, 866; 324/755.01, 755.11, 755.1; 148/559, 148/675
See application file for complete search history.

(56) References Cited

U.S. PATENT DOCUMENTS

| 3,045,334 | A | * | 7/1962 | Berzins .......................... 428/648 |
| 4,079,156 | A | * | 3/1978 | Youtsey et al. ............... 427/98.4 |
| 6,049,976 | A | * | 4/2000 | Khandros ........................ 29/843 |
| 2002/0100391 | A1 | * | 8/2002 | Inoue et al. .................. 106/1.22 |

FOREIGN PATENT DOCUMENTS

| JP | 2745744 B2 | 4/1998 |
| JP | 2008-145238 | 6/2008 |
| JP | 2008-190885 | 8/2008 |
| JP | 2009-094080 | 4/2009 |
| KR | 1020040045452 | 6/2004 |
| KR | 1020080085132 | 9/2008 |
| WO | WO03/027689 A1 | 4/2003 |
| WO | WO2008/090635 A1 | 7/2008 |

* cited by examiner

*Primary Examiner* — Peter DungBa Vo
*Assistant Examiner* — Jeffrey T Carley
(74) *Attorney, Agent, or Firm* — Ingrassia Fisher & Lorenz, P.C.

(57) ABSTRACT

A method for manufacturing a probed for an electrical test includes producing by a deposition technique a deposit including a probe main body portion made of a nickel-boron alloy and a probe tip portion projecting downward from the probe main body portion and made of a different conductive material from the probe main body portion. The method further includes annealing the deposit. The average grain diameter of the nickel-boron alloy is between 97 Å and 170 Å. The contained amount of boron is from 0.02 wt % to 0.20 wt %.

8 Claims, 12 Drawing Sheets

Rerationship
between the heat treatment and the HV hardness
and
the relationship
between the heat treatment and displacement Endurance evaluation result
(relation between
the number of time of TDs and
the displacement amount)

Current characteristics evaluation result
(relationship between
the applied current and
the probe pressure maintenance ratio)

Relationship between the heat treatment temperature and the displacement amount

Rerationship
between the heat treatment and the HV hardness
and
the relationship
between the heat treatment and displacement

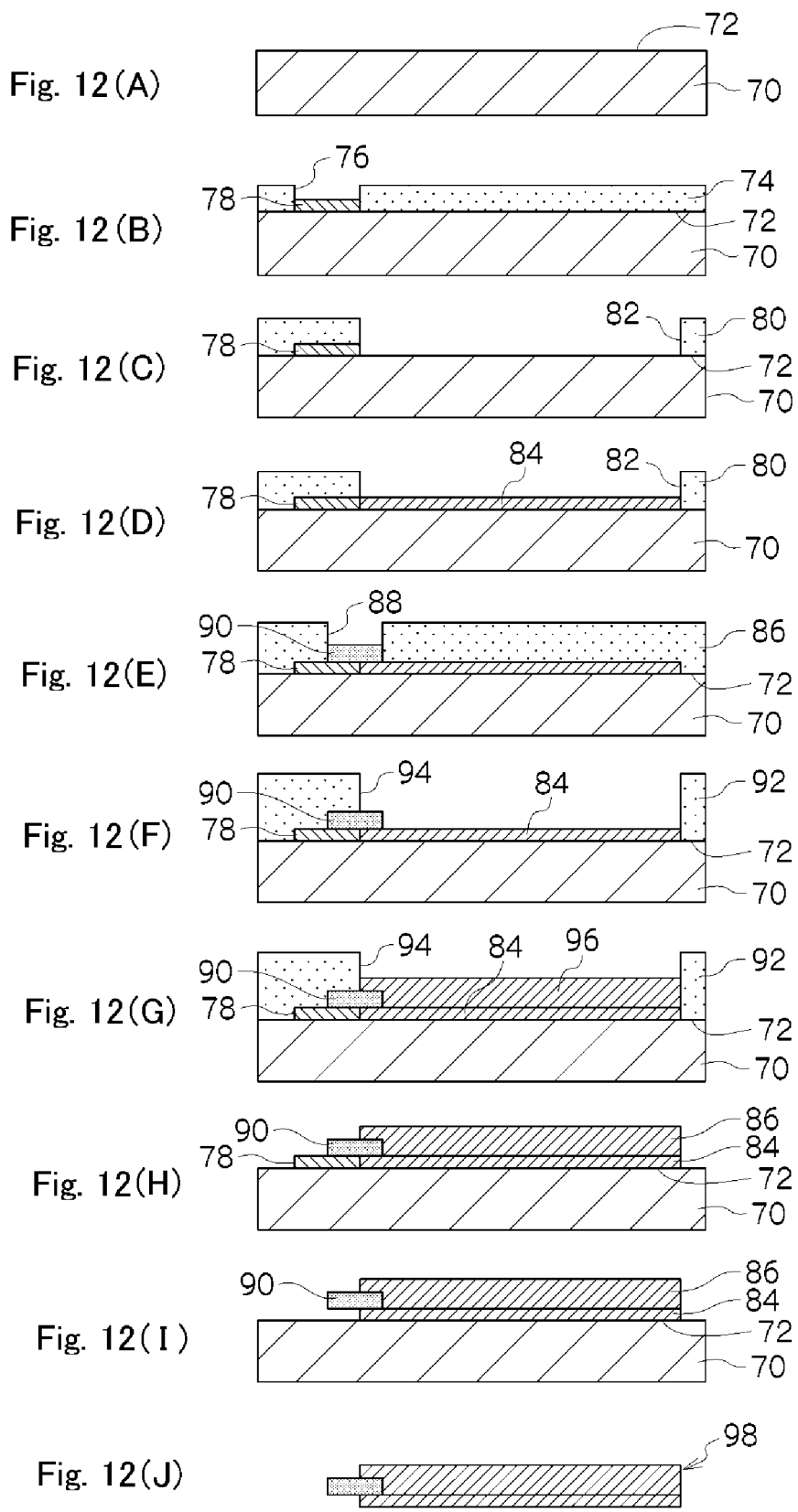

METHOD FOR MANUFACTURING A PROBE FOR AN ELECTRICAL TEST

PRIORITY CLAIM

The instant application claims priority to Japanese Patent Application No. 2009-263904, filed Nov. 19, 2009, which application is incorporated herein by reference in its entirety.

TECHNICAL FIELD

An embodiment of the subject matter relates to a probe for an electrical test having a probe main body portion made of a nickel-boron alloy, an electrical connecting apparatus using the same, and a method for manufacturing the probe.

BACKGROUND

Multiple semiconductor integrated circuits formed on a semiconductor wafer generally undergo an electrical test to determine whether or not they are manufactured in accordance with the specification before being separated into respective chips. In this electrical test, a probe assembly or an electrical connecting apparatus such as a probe card having a plurality of probes to be connected to electrodes of a device under test that is each semiconductor integrated circuit is used. The device under test is connected to a tester via the electrical connecting apparatus.

As an example of a conventional probe to be used for the electrical connecting apparatus of this kind, there is one having a plate-shaped needle main body portion or a probe main body portion and a needle tip portion or a probe tip portion provided at the probe main body portion and abutted on the electrode of the aforementioned device under test (for example, refer to Patent Document 1). The probe main body portion has a foot portion as an attachment portion to a probe board, an arm portion extending from the lower portion of the foot portion in a horizontal or lateral direction along the probe board to be spaced to the lower side of the probe board, and a pedestal portion projecting downward from the tip end portion of the arm portion. The aforementioned probe tip portion is provided at the pedestal portion.

In Patent Document 1, the probe main body portion is made of a conductive material having higher resiliency than a material for the probe tip portion while the probe tip portion provided at the lower end of the pedestal portion of the probe main body portion is made of a conductive material having more excellent hardness than the material for the probe main body portion.

In the above probe, the probe main body portion especially the arm portion is made of the metal material with excellent resiliency. Therefore the probe tip portion of the probe can be slid on the electrode of the device under test along with elastic deformation of the arm portion when the probe tip portion is thrust to the electrode of the device under test. This slide of the probe tip causes an oxide film on the electrode to be scraped away. Accordingly, overdriving causing the aforementioned elastic deformation effected on the arm portion of the probe brings about removal of the oxide film on the electrode by the probe tip of the probe tip portion, which enables mutual reliable electrical contact. Moreover, forming this probe tip portion by a highly hard material restricts abrasion of the probe tip portion caused by the slide of the probe tip.

The plate-shaped probe of this kind is manufactured with use of a photolithography technique and a deposition technique such as an electroforming. Also, the probe main body portion is generally made of nickel or a nickel alloy (Ni.W, Ni.P, Ni.Fe, Ni.Mn, Ni.Co, or the like).

However, the nickel-made probe main body portion has good electrical characteristics (low electrical resistance) but poor (weak) mechanical characteristics (spring characteristics) and will be plastically deformed or broken by repeated contacts effecting overdriving. On the other hand, the nickel alloy has good mechanical characteristics but poor electrical characteristics and will be deformed due to Joule heat when high current flows therein.

Patent Document 2 proposes to manufacture a probe that keeps appropriate hardness, is difficult to be embrittled, and is well resistant to creep by annealing the probe main body portion made of a nickel-manganese alloy. However, such a nickel-manganese-alloy-made probe cannot have sufficient mechanical characteristics because the nickel-manganese-alloy-made probe is produced with a minute metal atom.

Patent Document 3 proposes to form at least an elastic deformation portion (spiral portion) of a spiral probe by a nickel alloy such as Ni.P or Ni.B and heat such a spiral probe at 200° C. to 300° C. to keep the elastic deformation portion in an amorphous state. However, the probe whose elastic deformation portion is made of a nickel alloy in an amorphous state has poor electrical characteristics and is not suitable as a contact probe to be supported on a board in a cantilevered manner.

CITATION LIST

Patent Document 1: Japanese Patent Appln. Public Disclosure No. 2008-190885
Patent Document 2: Japanese Patent No. 2745744
Patent Document 3: Japanese Patent Appln. Public Disclosure No. 2009-94080

SUMMARY

It is an object of the embodiment of the subject matter to provide a probe that is good both in mechanical characteristics and electrical characteristics.

A probe for an electrical test according to the embodiment of the subject matter comprises a probe main body portion made of a nickel-boron alloy, and a probe tip portion projecting downward from the probe main body portion and made of a different conductive material from that for the probe main body portion. The crystal size of the nickel-boron alloy is 50 nm at the maximum, and the contained amount of the boron is 0.02 wt % or more and 0.20 wt % or less.

The probe main body portion may have a foot portion to be attached to a board, an arm portion extending from the lower end of the foot portion in a lateral direction, and a pedestal portion projecting downward from the tip end portion of the arm portion. The probe tip portion may project from the lower end of the pedestal portion.

An electrical connecting apparatus for an electrical test according to the embodiment of the subject matter comprises a board having a plurality of attachment portions on the lower surface, and a plurality of probes attached to the board in a cantilevered manner. The each probe is one described above and is attached to the attachment portion at the probe main body portion.

A method for manufacturing a probe for an electrical test according to the embodiment of the subject matter comprises steps of producing by a deposition technique a deposit including a probe main body portion made of a nickel-boron alloy and a probe tip portion projecting downward from the probe main body portion and made of a different conductive material from that for the probe main body portion, and annealing the deposit produced. The crystal size of the nickel-boron alloy is 50 nm at the maximum, and the contained amount of the boron is 0.02 wt % or more and 0.20 wt % or less.

The step of annealing may include a step of heating the deposit at a temperature of 200° C. or more and less than 400° C.

The step of annealing further include a step of heating the deposit at a temperature of 200° C. or more and less than 400° C. for 1 to 2 hours.

The method according to the embodiment of the subject matter may further comprise a step of naturally cooling the deposit to a room temperature after the step of annealing. Also, the annealing process and the natural cooling may be done in a constant-temperature chamber.

In the probe, the electrical connecting apparatus using the same, and the method for manufacturing the probe according to the embodiment of the subject matter, the probe main body portion is a nickel-boron alloy having the crystal size of 50 nm at the maximum and the contained amount of the boron of 0.02 wt % or more and 0.20 wt % or less. Thus, both the mechanical characteristics and electrical characteristics are favorable.

BRIEF DESCRIPTION OF DRAWINGS

FIGS. 12(A)-12(J) are a step diagram explain a method for manufacturing a probe.

DETAILED DESCRIPTION

Figure 1:
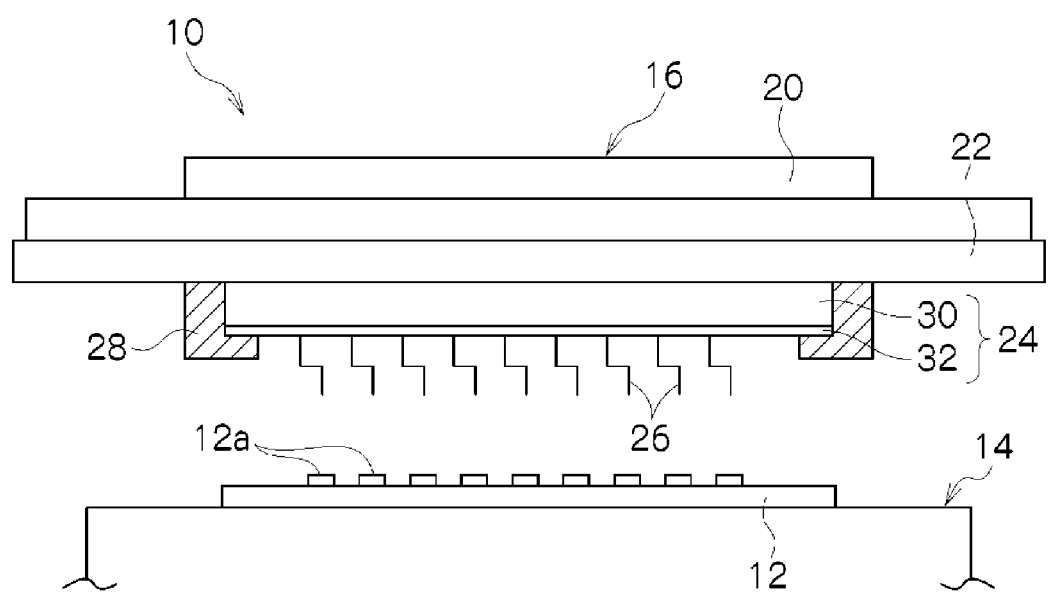
FIG. 1 is a front view showing an embodiment of an electrical connecting apparatus.

Referring to FIG. 1, a testing system 10 uses, as flat-plate-shaped devices under test, a plurality of integrated circuits formed on a semiconductor wafer 12 and is used in an electrical test in which these devices under test are tested at a time or in several batches. Each device under test has a plurality of electrodes 12a on the upper surface.

Referring to FIG. 1, the testing system 10 includes a chuck top 14 removably holding the semiconductor wafer 12 in a state where the electrodes 12a are directed upward and an electrical connecting apparatus 16 electrically connecting the wafer 12 (especially, devices under test) received on the chuck top 14 to electrical circuits for the test.

Test signals for the test include a supply signal (voltage, current) to be supplied to the wafer 12 (integrated circuit) for the purpose of obtaining a response signal and a response signal from the wafer 12 (integrated circuit) in response to the electrical signal.

The chuck top 14 is provided on a known test stage and has an upper surface removably holding the wafer 12 in a state where the electrodes 12a are directed upward. A method for holding the wafer 12 to the chuck top 14 may be vacuum adsorption.

The chuck top 14 and the connecting apparatus 16 is three-dimensionally relatively moved in three directions of X, Y within a horizontal plane and Z perpendicular to the horizontal plane, and angularly relatively rotated around a theta axis extending in the Z direction. In general, the chuck top 14 is three-dimensionally moved and angularly rotated around the theta axis extending in the Z direction relative to the connecting apparatus 16.

The connecting apparatus 16 includes a reinforcing member 20 having a flat lower surface, a circular flat-plate-shaped wiring board 22 held on the lower surface of the reinforcing member 20, a circular flat-plate-shaped probe board 24 arranged on the lower surface of the wiring board 22, a plurality of probes 26 arranged on the lower surface of the probe board 24, and an attachment ring 28 attaching the probe board 24 to the wiring board 22.

The reinforcing member 20 is a known one made of a metal material such as a stainless steel plate (for example, refer to Japanese Patent Appln. Public Disclosure No. 2008-145238). Such a reinforcing member 20 has an external annular portion, an internal attachment portion extending in a circumferential direction in the inside of the annular portion, a plurality of connection portions integrally connecting the annular portion to the attachment portion, and a plurality of extension portions extending outward in the radial direction from the annular portion. In the example shown in the figure, the reinforcing member 20 is shown in a state where a part inside the annular portion having approximately the same diameter dimension as that of the probe board 24 is protruded upward.

For example, as described in Japanese Patent Appln. Public Disclosure No. 2008-145238, an annular thermal deformation inhibitor restraining thermal deformation of the reinforcing member 20 may be arranged at the upper side of the reinforcing member 20, a cover covering an upper space of the wiring board 22 may be arranged, or the cover may be arranged at the upper side of the thermal deformation inhibitor.

The wiring board 22 is a known printed wiring board formed in a circular plate shape by an electrical insulating resin such as a glass-containing epoxy resin. Such a wiring board 22 has at the outer circumferential portion on the upper surface a plurality of first terminals (not shown) to be electrically connected to the electrical circuits for the test so as to transmit and receive the test signals to and from the electrical circuits for the test and has inside a plurality of conductive paths (not shown) connected to these terminals.

The wiring board 22 further has on the lower surface a plurality of second terminals (not shown) to be electrically connected to the probe board 24. Each second terminal is electrically connected to the conductive path. As many second terminals as the number of the probes 26 are provided.

The probe board 24 has a ceramic board 30 made of ceramic, and a flexible multi-layered sheet 32 made of an electrical insulating resin such as a polyimide resin and formed on the lower surface of the ceramic board 30 in the example shown in the figure.

The aforementioned probe board 24 has a plurality of internal wires (not shown) electrically connected to the second terminals of the wiring board 22 and has a plurality of probe lands (not shown) electrically connected to these internal wires on the lower surface of the multi-layered sheet 32. As many internal wires and probe lands as the number of the probes 26 are provided.

The reinforcing member 20 and the wiring board 22 are coaxially coupled by a plurality of screw members (not shown) in a state where the lower surface of the reinforcing member 20 and the upper surface of the wiring board 22 abut on each other. On the other hand, the probe board 24 is attached to the lower surface of the wiring board 22 with use of the attachment ring 28 and a plurality of screw members so that the probes 26 may be directed downward.

An electrical connector may be arranged between the wiring board 22 and the probe board 24 so that the conductive paths of the wiring board 22 and the internal wires of the probe board 24 may be electrically connected by the electrical connector. As such an electrical connector, a known one described in Japanese Patent Appln. Public Disclosure No. 2008-145238 may be used, for example.

Figure 2:
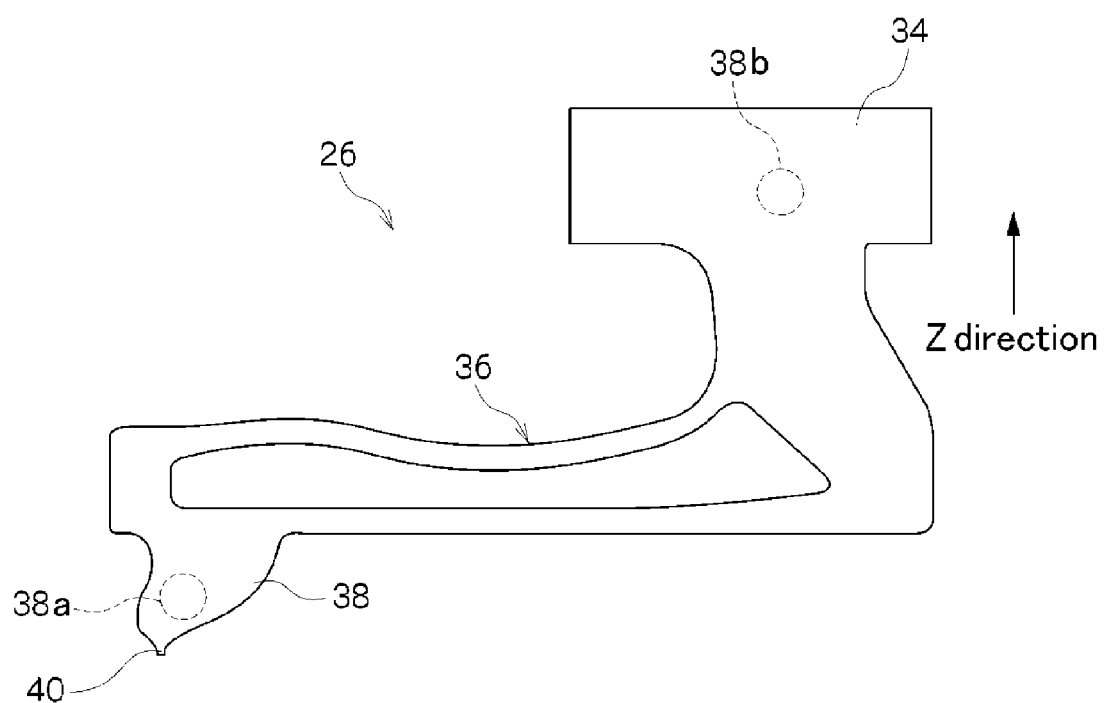
FIG. 2 shows an embodiment of a probe.
Figure 3:
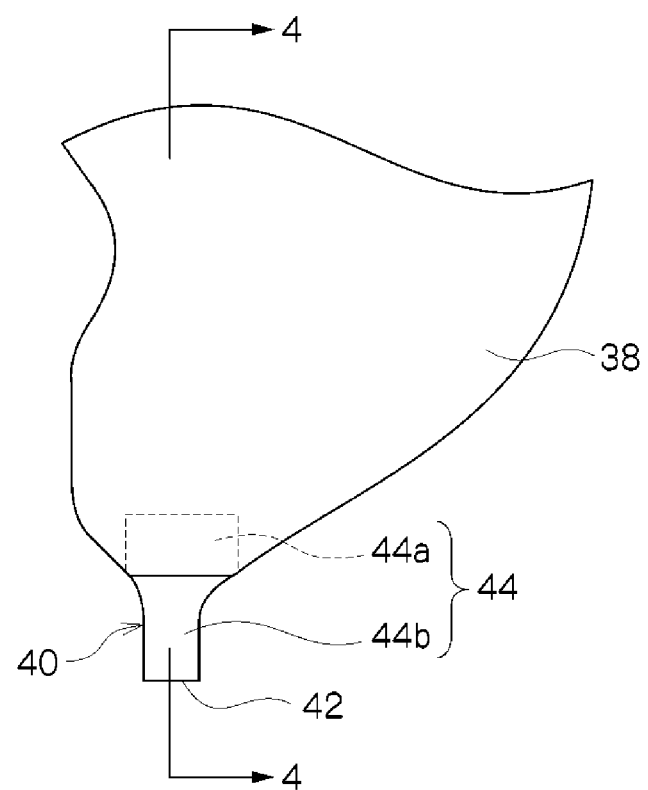
FIG. 3 is an enlarged view of a probe tip portion and its proximity of the probe shown in FIG. 2.
Figure 4:
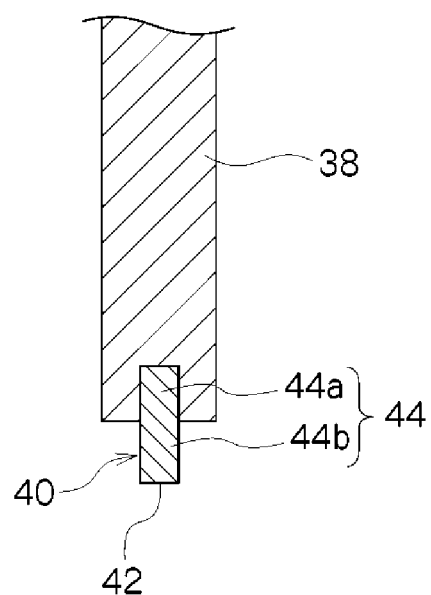
FIG. 4 is a cross-sectional view obtained along the line 4-4 in FIG. 3.

Each probe 26 includes an attachment portion or a foot portion 34 extending in an up-down direction, an arm portion 36 extending from the lower portion of the foot portion 34 in a lateral direction (horizontal direction) intersecting with the extending direction of the foot portion 34, a pedestal portion 38 projecting downward from the tip end portion of the arm portion 36, and a probe tip portion 40 projecting downward from the pedestal portion 38 as shown in FIGS. 2 to 4.

In the example shown in the figures, the foot portion 34, the arm portion 36, and the pedestal portion 38 form a flat-plate-shaped needle main body or a probe main body portion. As for the lower end portion of the probe tip portion 40, a lower end having the smallest cross-sectional area is a probe tip 42 to be thrust to the electrode of the integrated circuit on the wafer 12.

Each probe 26 is mounted at the upper end portion of the foot portion 34 to the aforementioned probe land in a cantilevered manner in a state where its probe tip 42 projects downward by a method such as joint by a conductive jointing material such as solder, weld by laser, or the like.

In the example shown in FIG. 1, only about 10 probes 26 are shown, but as many as over 20,000 probes 26 are actually provided when the wafer 12 has a diameter dimension of 300 mm, for example. The height positions of the probe tips 42 of these probes 26 are on the same plane.

The foot portion 34, the arm portion 36, and the pedestal portion 38 forming the probe main body portion of each probe 26 are made of a nickel-boron alloy (Ni.B alloy) having higher brittleness than that of the probe tip portion 40 and being in a crystalline state (non-amorphous state).

On the other hand, the probe tip portion 40 is made of a conductive material having higher hardness than that of the probe main body portion. Examples of the conductive material for the probe tip portion 40 are rhodium, tungsten, cobalt, and alloys of nickel and each of these (nickel alloys).

The crystal size of the nickel-boron alloy mainly forming the probe main body portion is 50 nm or less (that is, 50 nm at the maximum), and the contained amount of boron is 0.02 wt % or more and 0.20 wt % or less.

As shown in FIG. 4, a conductive material 44 forming the probe tip portion 40 buries a part 44a in the pedestal portion 38 and protrudes a remaining part 44b downward from the pedestal portion 38 to form the probe tip portion. Thus, the pedestal portion 38 is formed by the part 44a of the conductive material 44 as well as the nickel-boron alloy, but its main material is the nickel-boron alloy.

EXPERIMENTAL EXAMPLE 1

As shown in Table 1, several Ni Probes A whose probe main body portion is mainly made of nickel (Ni), several Ni.P Probes B whose probe main body portion is mainly made of a nickel-phosphorus alloy (Ni.P alloy), several Ni.Mn Probes C whose probe main body portion is mainly made of a nickel-manganese alloy (Ni.Mn alloy), and several Ni.B Probes D whose probe main body portion is mainly made of a nickel-boron alloy (Ni.B alloy) were manufactured by an electroforming and heat-treated to complete them. In the heat treatment (annealing treatment), the probes were heated in a 300° C. constant-temperature chamber for 1 hour and naturally cooled in the constant-temperature chamber to a room temperature.

Each probe is formed in the shape shown in FIGS. 2 to 4. Also, the contained amounts of phosphorus, manganese, and boron in Probes B, C, and D are average values.

Such Probes A, B, C, and D heat-treated were supported to a support member in a cantilevered manner by fixing their foot portions 34, in which state 200 μm overdriving (OD) was effected on the probes, thereafter the overdriving was released to free the probe tip portion 40. In this step, and the displacement amount (μm) of the height position of each probe tip portion 40 in the Z direction, specific resistance (mΩ), and HV hardness were derived. As for the specific resistance, the resistance between parts 38a and 38b in FIG. 2 was measured by a four-terminal method. The result is shown in Table 1.

TABLE 1

| | Probe displacement amount in the case of OD 200 μm (μm) | Specific resistance (mΩ) | HV hardness (after heat treatment) |
|---|---|---|---|
| A: Ni | 6.0 μm | 45 | 726 |
| B: NiP (P: 10 wt %) | 0 μm | 315 | 600 |
| C: NiMn (Mn: 3 wt %) | 4.6 μm | 52 | 735 |
| D: NiB (B: 18 wt %) | 0.4 μm | 58 | 770 |

As is apparent from Table 1, the relationship on mechanical characteristics and the relationship on electrical characteristics among the Probes are as follows.

Mechanical characteristics: Ni Probe A≤Ni.Mn Probe C<Ni.B Probe D<Ni.P Probe B

Electrical characteristics: Ni.P Probe B<Ni.B Probe D<Ni.Mn Probe C≤Ni Probe A

As a result of the above, since Ni.B Probe D has greater displacement amount than Probes A and C and greater specific resistance than Probe B and greater HV hardness than any of Probes A, B, and C, it has been apparent that Probe D has both great mechanical characteristics and great electrical characteristics.

EXPERIMENTAL EXAMPLE 2

Three kinds of Probes A, B, and D, which are the same ones as those in Experimental example 1, were manufactured by the same electroforming as that in Experimental example 1 and underwent the annealing treatment in which Probes A, B, and D were heated under the same temperature conditions as those in Experimental example 1 and naturally cooled in the constant-temperature chamber in the same manner as that in Experimental example 1.

Each probe was supported to the support member at its foot portion 34 in the same state as that in Experimental example 1, and conducted 500,000 touchdowns (TD) to a conductive plate with 120 nm overdriving. The endurance evaluation result (relationship between the number of times of TDs and the displacement amount (μm) of the height position of the probe tip 42 in the Z direction) and the current characteristics evaluation result (relationship between the applied current and the probe pressure maintenance ratio) under such conditions are shown in FIGS. 5 and 6, respectively.

Figure 5:
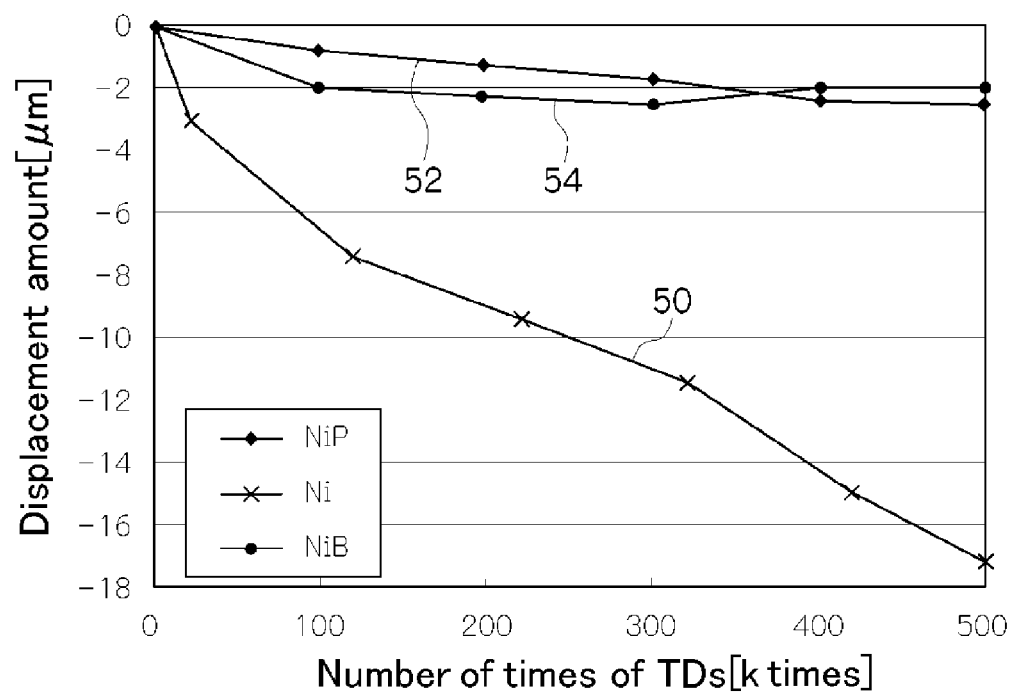
FIG. 5 is a graph showing the endurance evaluation result (relationship between the number of times of TDs and the displacement amount).
Figure 6:
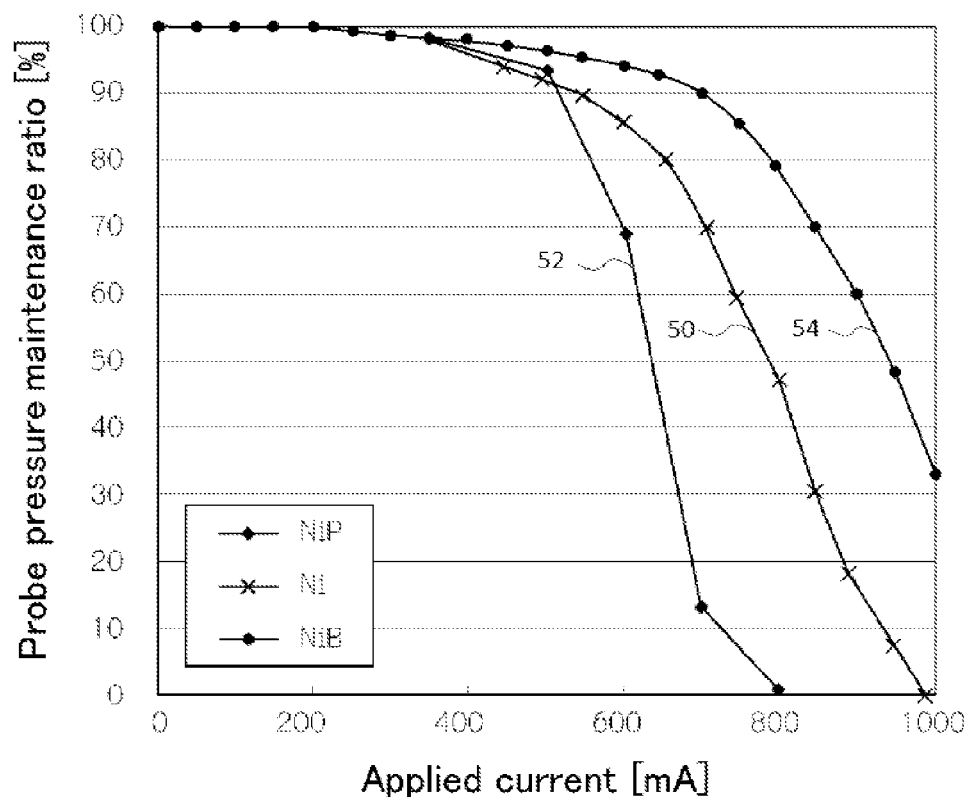
FIG. 6 is a graph showing the current characteristics evaluation result (relationship between the applied current and the probe pressure maintenance ratio).

In FIGS. 5 and 6, the number of times of TDs is shown by k times (1000 times), and the curves 50, 52, and 54, respectively show evaluation results of Probes A, B, and D. It has been apparent from FIGS. 5 and 6 that Probe D has greater displacement amount and specific resistance than Probe B and greater HV hardness than any of Probes A and B.

From FIGS. 5 and 6, the relationship on mechanical characteristics and the relationship on electrical characteristics among the Probes are as follows.

Mechanical characteristics: Ni Probe A<Ni.P Probe B≈Ni.B Probe D

Electrical characteristics: Ni.P Probe B<Ni Probe A<Ni.B Probe D

As a result of the above, it has been apparent that Ni.B Probe D has both greater mechanical characteristics and greater electrical characteristics than Ni Probe A or Ni.P Probe B.

EXPERIMENTAL EXAMPLE 3

Figure 7:
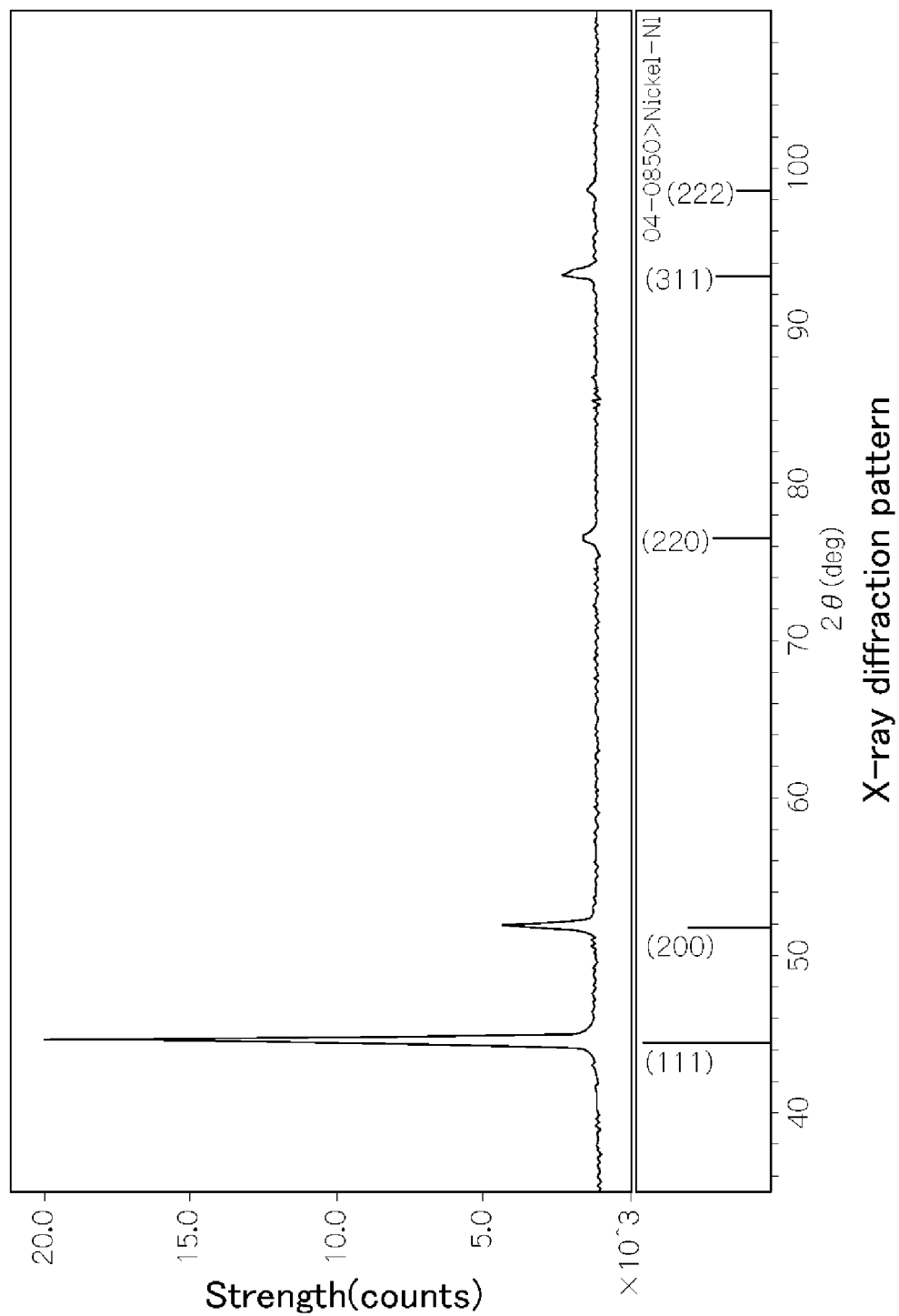
FIG. 7 shows the X-ray diffraction pattern of an Ni.B probe.

As for each of the plural Probes D used in the above Experimental examples 1 and 2, the measurement result of the contained amount (wt %) of boron in the Ni.B alloy, the measurement result of the crystal grain size, and the X-ray diffraction pattern are shown in Table 2, Table 3, and FIG. 7, respectively, and the measurement conditions of X-ray diffraction are shown in Table 4.

TABLE 2

| | (wt %) | | | | |
|---|---|---|---|---|---|
| | 1 | 2 | 3 | 4 | Ave |
| B | 0.23 | 0.14 | 0.17 | 0.16 | 0.18 |
| Ni | 99.77 | 99.86 | 99.83 | 99.84 | 99.82 |

TABLE 3

| Peak | 2θ (°) | d (Å) | Height (counts) | Area (counts) | Half-value width (°) | Integral width (°) | Crystallite size (Å) |
|---|---|---|---|---|---|---|---|
| Ni (111) | 44.522 | 2.0333 | 6797 | 405449 | 0.437 | 0.596 | 170 |
| Ni (200) | 51.861 | 1.7615 | 2641 | 225762 | 0.615 | 0.855 | 112 |
| Ni (220) | 76.375 | 1.2459 | 170 | 18635 | 0.964 | 1.096 | 97 |
| Ni (311) | 92.948 | 1.0624 | 414 | 46917 | 0.988 | 1.133 | 107 |
| | | | | | | | Average: 122 |

TABLE 4

| [Measurement conditions] | |
|---|---|
| Measuring instrument: | EPMA |
| Accelerating voltage | 10 kV |

TABLE 4-continued

| [Measurement conditions] | |
|---|---|
| Beam diameter | 10 μm |
| Analysis time | 100 sec |
| Magnification | ×4000 |

It has been apparent from Tables 2 and 3 and FIG. 7 that Ni.B Probe D includes the average contained amount of boron in the Ni.B alloy of 0.18 wt %, has the average grain diameter of 122 Å (12.2 nm), presents strong peaks on the Ni (111) surface and the Ni (200) surface, and is not in an amorphous state.

EXPERIMENTAL EXAMPLE 4

Six Ni.B Probes D that were manufactured by the same electroforming as that in Experimental example 1 but had not been annealed yet were heated for 1 hour at 100° C., 200° C., 300° C., 360° C., 400° C., and 450° C., respectively and naturally cooled in the constant-temperature chamber in the same manner as that in Experimental example 1 to complete them. The displacement amount (μm) of the height position of each probe tip in the Z direction when 200 μm overdriving was effected on these probes and HV hardness, were measured.

Figure 8:
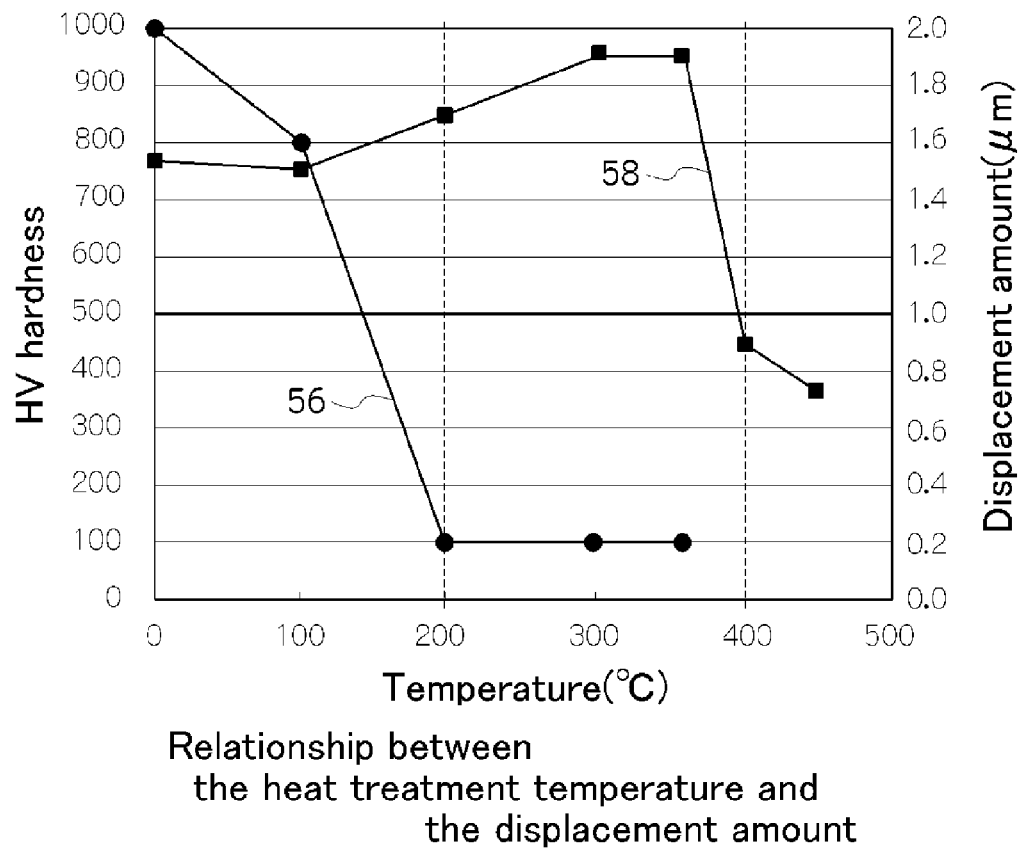
FIG. 8 is a graph showing the relationship between the heat treatment temperature and the HV hardness and the relationship between the heat treatment temperature and the displacement amount of the height position of the probe tip.

The measurement result is shown in FIG. 8. In FIG. 8, curves 56 and 58 represent the displacement amount and the hardness, respectively.

As is apparent from FIG. 8, the hardness decreased when the annealing temperature was 400° C. or higher, and the displacement amount with the 200 μm overdriving could not be measured when the temperature was 400° C. or higher due to breakage of the probe.

It has been apparent from FIG. 8 that the preferable upper limit of the heat treatment temperature is below 400° C. to prevent breakage of the probe, and the preferable lower limit is 200° C. at which favorable hardness and displacement amount are obtained.

EXPERIMENTAL EXAMPLE 5

Six Ni.B Probes D that were manufactured by the same electroforming as that in Experimental example 1 but had not been heat-treated yet were respectively annealed at the same annealing temperature of 300° C. for 0.5 hours, 1 hour, 2 hours, 3 hours, 4 hours and 8 hours, and naturally cooled in the constant-temperature chamber in the same manner as that in Experimental example 1 to complete them. The displacement amount (μm) of the height position of each probe tip in the Z direction when 200 μm overdriving was effected on these probes and HV hardness were measured.

Figure 9:
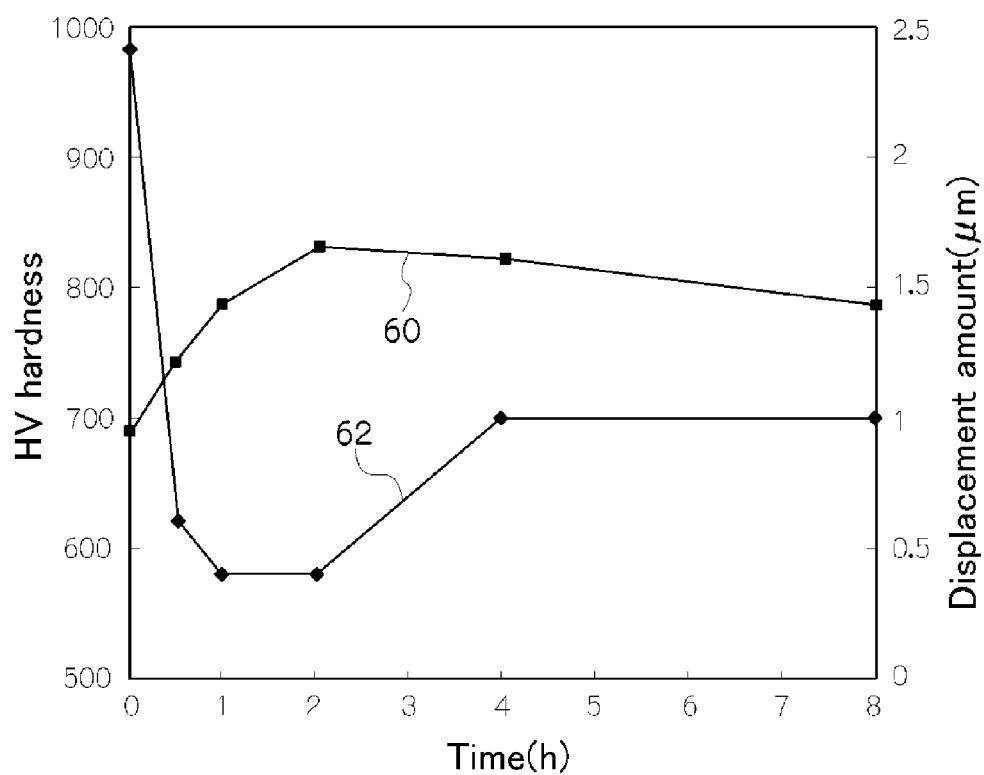
FIG. 9 is a graph showing the relationship between the heat treatment time and the HV hardness and the relationship between the heat treatment time and the displacement amount of the height position of the probe tip.

The result is shown in FIG. 9. In FIG. 9, curves 60 and 62 represent the hardness and the displacement amount, respectively. It has been apparent from FIG. 9 that the preferable annealing time is in the range of 1 to 2 hours that provides small displacement amount and high hardness.

EXPERIMENTAL EXAMPLE 6

Plural Ni.B Probes D having different contained amounts (wt %) of boron were manufactured in the same manner as that in Experimental example 1. The stress (MPa) and the HV hardness of these probes were measured. The measurement results of the stress and the HV hardness are shown in FIGS. 10 and 11, respectively.

Figure 10:
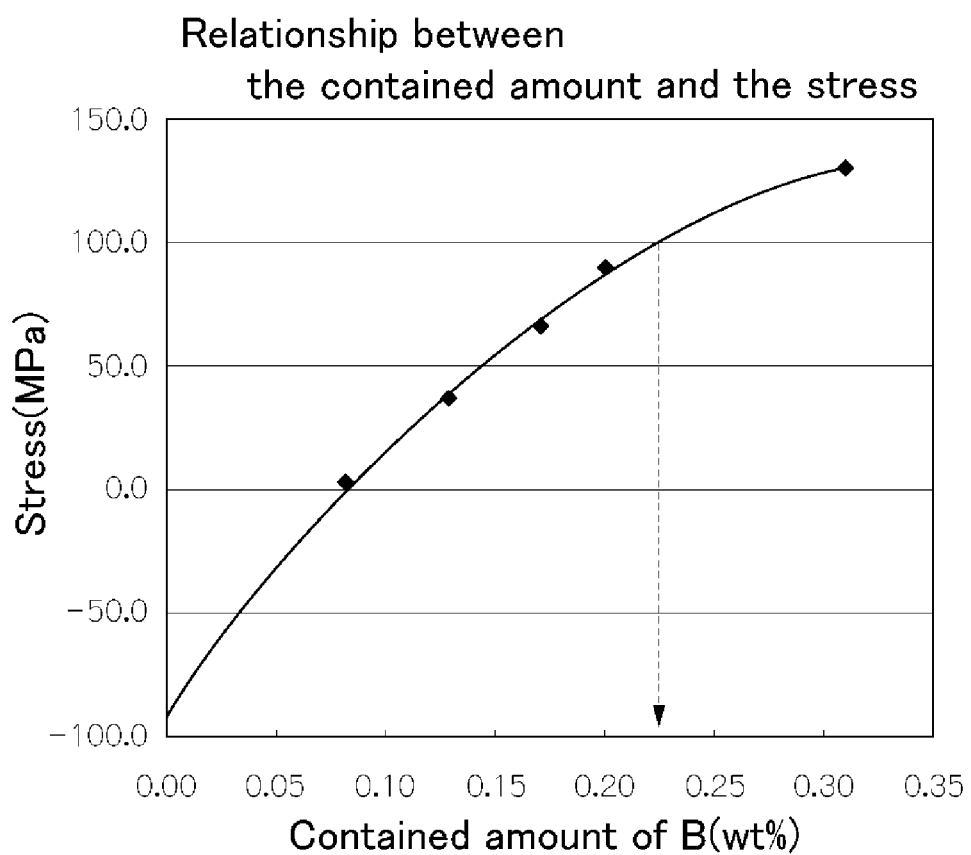
FIG. 10 is a graph showing the relationship between the contained amount of boron and the stress.
Figure 11:
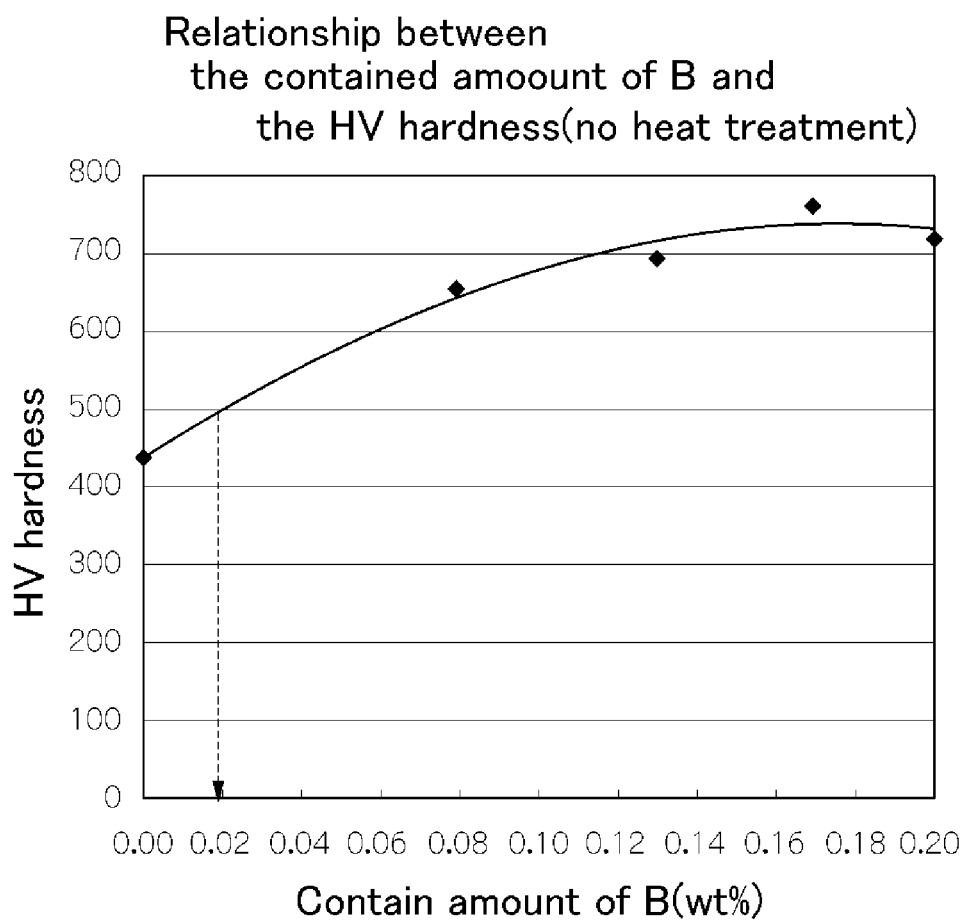
FIG. 11 is a graph showing the relationship between the contained amount of boron and the HV hardness.

It has been apparent from FIG. 10 that the stress increases along with increase of the contained amount of boron. However, when the stress is 100 MPa or more, a stable plating film cannot be produced. Also, it has been apparent from FIG. 11 that the hardness is greater along with increase of the contained amount of boron.

When the contained amount of boron is 0.08 wt % or more, both the mechanical characteristics and the electrical characteristics of Ni.B Probe D are great. Also, if the HV hardness of Ni.B Probes D is below 500, it is difficult to achieve favorable mechanical characteristics. Consequently, the contained amount of boron is preferably in the range of 0.02 wt % to 0.20 wt %.

Example of a Manufacturing Method

Next, a method for manufacturing the probe 26 will be described with reference to FIG. 12(A)-(J). In the following example, one probe as a representative of multiple probes to be formed simultaneously will be described for simplicity of description and drawings.

First, as shown in FIG. 12 (A), a metal plate such as a silicon wafer is prepared as a base 70, and a seed layer 72 is formed on the upper surface of the base 70. The seed layer 72 can be formed by plating on the upper surface of the base 70 a metal material such as copper that can be removed by an etching process.

Next, as shown in FIG. 12 (B), a photoresist 74 is applied on the seed layer 72, an opening 76 taking the form of the conductive material 44 forming a part of the probe tip portion 40 is formed and its neighborhood in the photoresist 74, and a sacrificial layer 78 is formed in the opening 76. The sacrificial layer 78 can be formed by depositing in the opening 76 a metal material such as copper that can be removed by an etching process with use of a deposition technique such as an electroforming, a vapor-deposition, or a sputtering.

Next, as shown in FIG. 12 (C), the photoresist 74 is removed, a photoresist 80 is applied on the exposed seed layer 72 and the sacrificial layer 78, and an opening 82 taking the form of the probe main body portion is formed in the photoresist 80.

Next, as shown in FIG. 12 (D), a metal material layer 84 acting as a part of the probe main body portion is formed in the opening 82. The metal material layer 84 can be formed by depositing in the opening 82 an Ni.B alloy whose contained amount of boron is 0.02 wt % or more and 0.20 wt % or less with use of the aforementioned deposition technique.

Next, as shown in FIG. 12 (E), the photoresist 80 is removed, a photoresist 86 is applied on the exposed seed layer 72, the sacrificial layer 78, and the metal material layer 84, an opening 88 taking the form of the conductive material 44 forming a part of the probe tip portion 40 and its neighborhood is formed in the photoresist 86, and a conductive material layer 90 that will form the part of the probe tip portion 40 and its neighborhood is formed in the opening 88. The conductive material layer 90 can be formed by depositing in the opening 88 a highly hard metal material such as rhodium with use of the aforementioned deposition technique.

Next, as shown in FIG. 12 (F), the photoresist 86 is removed, a photoresist 92 is applied on the exposed seed layer 72, the sacrificial layer 78, the metal material layer 84, and the conductive material layer 90, and an opening 94 taking the form of the remaining part of the probe main body portion is formed in the photoresist 92.

Next, as shown in FIG. 12 (G), a metal material layer 96 acting as the remaining part of the probe main body portion is formed in the opening 94. The metal material layer 96 can be formed by depositing in the opening 94 an Ni.B alloy whose contained amount of boron is 0.02 wt % or more and 0.20 wt % or less with use of the aforementioned deposition technique.

Next, the photoresist 92 is removed as shown in FIG. 12 (H), the sacrificial layer 78 is removed by an etching process as shown in FIG. 12 (I), and the seed layer 72 is removed by an etching process as shown in FIG. 12 (J).

As a result of the above, multiple deposits 98 each having the same shape as that of the probe shown in FIG. 2 are formed.

The deposits 98 obtained are heated in the constant-temperature chamber at a temperature of 200° C. or more and less than 400° C. for 1 to 2 hours and naturally cooled in the constant-temperature chamber to a room temperature. In this manner, the deposits 98 are completed as the probes 26.

Although the probe board 24 is attached to the wiring board 22 in the above embodiments, the wiring board 22 may be omitted, or the probes 26 may be attached to the wiring board 22, the probe board 24 may be omitted, and the wiring board 22 itself may act as a probe board.

The described subject matter is not limited to the above embodiments but may be altered in various ways without departing from the spirit and scope of the presented here.

What is claimed is:

1. A method for manufacturing a probe for an electrical test, comprising steps of:
   producing by a deposition technique a deposit including a probe main body portion made of a nickel-boron alloy and a probe tip portion projecting downward from said probe main body portion and made of a different conductive material from that for said probe main body portion; and
   annealing said deposit produced,
   wherein the average grain diameter of said nickel-boron alloy is between 97 Å and 170 Å, and the contained amount of said boron is from 0.02 wt % to 0.20 wt %.

2. The method according to claim 1, wherein said step of annealing includes a step of heating said deposit at a temperature of from 200° C. to 400° C.

3. The method according to claim 1, wherein said step of annealing further includes a step of heating said deposit at a temperature of from 200° C. to 400° C. for 1 to 2 hours.

4. The method according to claim 2, further comprising a step of naturally cooling said deposit to a room temperature after said annealing process.

5. The method according to claim 4, wherein said step of annealing and said natural cooling are done in a chamber.

6. The method according to claim 3, further comprising a step of naturally cooling said deposit to a room temperature after said annealing process.

7. The method according to claim 6, wherein said step of annealing and said natural cooling are done in a chamber.

8. The method according to claim 1, wherein the crystal size of said nickel-boron alloy is about 122 Å.

* * * * *